United States Patent [19]
Pitts et al.

[11] Patent Number: 5,346,729
[45] Date of Patent: Sep. 13, 1994

[54] SOLAR-INDUCED CHEMICAL VAPOR DEPOSITION OF DIAMOND-TYPE CARBON FILMS

[75] Inventors: J. Roland Pitts, Lakewood; C. Edwin Tracy, Golden; David E. King, Lakewood, all of Colo.; James T. Stanley, Beaverton, Oreg.

[73] Assignee: Midwest Research Institute, Kansas City, Mo.

[21] Appl. No.: 62,840

[22] Filed: May 17, 1993

[51] Int. Cl.$^5$ .................. B05D 3/06; C23C 16/00
[52] U.S. Cl. .................. 427/582; 427/585; 427/249; 427/255.1; 427/299; 427/122; 423/446
[58] Field of Search .............. 427/582, 585, 595, 249, 427/122, 255.1, 314, 299; 423/446; 156/DIG. 68

[56] References Cited

U.S. PATENT DOCUMENTS

| | | |
|---|---|---|
| 4,565,618 | 1/1986 | Banks . |
| 4,869,923 | 9/1989 | Yamazaki . |
| 4,992,298 | 2/1991 | Deutchman et al. . |
| 5,015,494 | 5/1991 | Yamazaki . |
| 5,053,180 | 10/1991 | Deutchman et al. . |

FOREIGN PATENT DOCUMENTS

| | | |
|---|---|---|
| 61-236691 | 10/1986 | Japan . |
| 62-138394 | 6/1987 | Japan . |
| 63-288991 | 11/1988 | Japan . |
| 63-288992 | 11/1988 | Japan . |

Primary Examiner—Roy V. King
Attorney, Agent, or Firm—Ken Richardson

[57] ABSTRACT

An improved chemical vapor deposition method for depositing transparent continuous coatings of $sp^3$-bonded diamond-type carbon films, comprising: a) providing a volatile hydrocarbon gas/$H_2$ reactant mixture in a cold wall vacuum/chemical vapor deposition chamber containing a suitable substrate for said films, at pressure of about 1 to 50 Torr; and b) directing a concentrated solar flux of from about 40 to about 60 watts/$cm^2$ through said reactant mixture to produce substrate temperatures of about 750° C. to about 950° C. to activate deposition of the film on said substrate.

12 Claims, 8 Drawing Sheets

SOLAR-INDUCED CHEMICAL VAPOR DEPOSITION OF DIAMOND-TYPE CARBON FILMS

The United States Government has rights in this invention under Contract No. DE AC02-83CH10093 between the United States Department of Energy and the National Renewable Energy Laboratory, a division of the Midwest Research Institute.

BACKGROUND OF THE INVENTION

1. Field of the Invention

The present invention relates to a novel chemical vapor deposition (CVD) process for depositing $sp^3$-bonded diamond-type carbon films via a non-electrically driven radiant energy source. More specifically, the present invention relates to the use of a concentrated solar flux directed through a volatile hydrocarbon gas/$H_2$ reactant mixture to produce temperature ranges on a substrate of approximately 750° C.–950° C. at pressures of 1 to 50 Torr in a specialized cold wall vacuum/CVD chamber to produce $sp^3$-bonded diamond-type carbon on the substrate.

2. Description of the Prior Art

The development of CVD processes to produce a carbon coating with the intrinsic properties of diamond has been a subject of considerable interest and investigation in the scientific community, since synthetic amorphous and crystalline diamond-type materials provide an unusual combination of properties such as high values of hardness, density, refractive index, transparency, chemical/electronic resistance and thermal conductivity.

However, except for the acetylene torch method, conventional options for the CVD processing of diamond (and even non-diamond materials) all have one common drawback; namely, they require electrically-generated thermal or photolytic activation to produce a product. These energy-intensive electrical processes entail the use of inefficient multiple conversions of energy resources such as: primary resource (fossil fuels or nuclear material) to heat; heat to electricity; and the use of electricity back to heat or radiant energy.

In prior art processes, energy losses at each conversion step were either ignored, tolerated, or accepted due to the erroneous prevailing view that the economy of the whole process was based on cheap and limitless energy resources. Moreover, the environmental liability or hazards utilizing the additional consumption of fossil fuels or nuclear material to support this energy waste appears not to have been seriously considered.

For example, in U.S. Pat. No. 4,565,618 an apparatus is described that permits diamond-like carbon flakes to be produced by the deposition of carbon from a beam containing carbon ions and atoms onto a smooth surface that is simultaneously ion beam sputtered. The bombarding ions have sufficient energy to create diamond bonds; however, the process in this patent uses a physical vapor deposition process that produces flakes, rather than continuous coatings.

A process for forming a film adhered to a substrate in an evacuated atmosphere is disclosed in U.S. Pat. No. 4,992,298. Essentially, the process describes a method of ballistically alloying a very thin film to a substrate and subsequently depositing a second layer of polycrystalline diamond onto it. This process is somewhat of a variation of the process in U.S. Pat. No. 4,565,618 in that it substitutes a sputter target for the electric arc evaporation. Furthermore, the process of this patent describes a physical vapor deposition (PVD) process and specifically excludes hydrogen from the vacuum chamber.

U.S. Pat. No. 5,055,318 discloses a low-temperature process for forming a stress-reduced film adhered to a substrate in an evacuated atmosphere, comprising: depositing a layer of a desired non-hydrocarbon substance on the substrate with a low energy, sputtered atomic beam; simultaneously exposing the substrate to a first, high energy beam of inert atoms to grow a ballistically alloyed layer of an initial desired thickness; reducing the first, high energy beam to a second, substantially less high energy beam to obtain a film of a final desired thickness on the ballistically alloyed surface of the substrate. This process is a PVD process; it uses expanded energy ranges for the ion beams, and can replace the sputtering ion beam and target with a thermal evaporation source. Nevertheless, the process also specifically excludes hydrogen from the vacuum chamber.

A microwave enhanced CVD method for depositing carbon is described in U.S. Pat. No. 4,869,923, wherein plasma enhanced CVD using electronic cyclotron resonance (ECR) or a modified cyclotron resonance (MCR) at higher pressures is used to grow diamond-thin films; however, the process in this patent must employ a DC magnetic field established in the microwave (2.45 GHz) or radio frequency (13.56 MHz) plasma to induce the ECR or MCR conditions to excite the reactants in gas phase, before impact with the substrate surface. Further, the process of this patent utilizes infrared or halogen lamp radiation to heat the substrates and requires nitrogen gas as a constituent of the precursor stream.

U.S. Pat. No. 5,015,494 uses a cyclotron resonance chemical vapor deposition method to form a diamond or diamond-like carbon material on a substrate by: inputting at least one reactive gas containing carbon in a reaction chamber; emitting a microwave into the reaction chamber at a predetermined frequency and in a predetermined direction; establishing a magnetic field in the reaction chamber where the direction of the magnetic field is parallel to the direction of the microwave and the strength of the magnetic field is such as to cause cyclotron resonance at a predetermined position in the reaction chamber; exhausting the reaction chamber to establish a pressure range of 0.1 to 300 Torr; holding the substrate at the predetermined, cyclotron resonance position in the reaction chamber; and depositing a diamond-like carbon material on a surface of the substrate; however, the process in this patent also requires a DC magnetic field established in a microwave or radio frequency plasma to induce the ECR or MCR conditions to excite the reactants in the gas phase before impact with the substrate surface. The process in this patent is similar to that in U.S. Pat. No. 4,869,923 in that it utilizes infrared or halogen lamp radiation to heat the substrates from the backside when required, and requires nitrogen gas as a constituent of its precursor stream.

SUMMARY OF THE INVENTION

One object of the present invention is to provide a solar-induced CVD process for producing continuous coatings of $sp^3$-bonded diamond-type films that is more energy efficient and more environmentally benign than conventional processes.

It is another object of the present invention to provide a solar-induced CVD process for producing continuous coatings of sp³-bonded diamond-type films wherein direct utilization of concentrated solar energy eliminates the wasteful drawbacks of predominantly electrically-driven processes, so that fossil fuels do not have to be dug from the ground, processed, and burned, and thereby creating the necessity of scrubbing by-products of these fuels for release to the environment.

Another object of the present invention is to provide a solar-induced CVD process for producing continuous coatings of sp³-bonded diamond-type films so that uranium does not have to be mined, refined, and stored for years as a radioactive hazard in order to provide electric power to the CVD process.

Yet another object of the invention is to provide a solar-induced CVD process for producing continuous coatings of sp³-bonded diamond-type films wherein the solar furnace process utilized provides a means for delivering large photon flux densities over short time spans that permit exceptionally high heating rates.

Another object yet still of the present invention is to provide a solar-induced CVD process for producing continuous coatings of sp³-bonded diamond-type films wherein high-energy photons in the UV region of the solar spectrum can directly interact with reactant species on substrate surfaces to produce catalytic increases in the efficiency of deposition.

A still further object of the present invention is to provide a solar-induced CVD process for producing continuous coatings of sp³-bonded diamond-type films especially suited for processing diamond-type materials in space so that: the non-electrical nature and inherent efficiency of the solar CVD process, coupled with the increased intensity of radiation outside the earth's atmosphere provides natural advantages; capitalization on both increased intensity and extension of the UV solar spectrum in vacuum AM-O irradiance provides increased opportunity for photolytic activation of the CVD process, inasmuch as high-energy UV radiation below 400 nm comprises 2½ percent of the total ($\lambda$ min$\approx$305 nm) for terrestrial AM-1.5 and quintuples to approximately 13% ($\lambda$ min$\approx$200 nm) for AM-0 in space; utilization of the absence of gravity to eliminate most of the structural engineering and support that would be required of a terrestrial solar furnace, and allow inexpensive and light weight construction in space is obtained; and advantage is taken of the natural vacuum environment in space to eliminate expensive vacuum pumps and thereby make it very convenient for low pressure processing.

To achieve the foregoing and other objects in accordance with the present invention, a concentrated solar flux of 40 to 60 watts/cm² is directed preferably through a $CH_4/H_2$ reactant mixture, to produce substrate temperature ranges of between about 750° C.-950° C. at pressures of 1-50 Torr in a specialized cold wall vacuum/CVD chamber. The reactant gases are metered through a mass-flow controlled manifold into a stainless steel reactor. Concentrated sunlight from the solar furnace is directed through a suitable transparent face plate, such as a quartz face plate, to produce predominantly thermal activation of the CVD process to deposit SP³-bonded diamond-type continuous carbon films.

BRIEF DESCRIPTION OF THE DRAWINGS

The accompanying drawings, which are incorporated in and form part of the specification, illustrate preferred embodiments of the present invention, and together with the description, serve to explain the principles of the invention. In the drawings.

DETAILED DESCRIPTION OF THE PREFERRED EMBODIMENTS

In general, the improved CVD method for depositing continuous coatings of sp³-bonded diamond-type carbon film is accomplished by: providing a volatile hydrocarbon/hydrogen or neopentane reactant mixture in a cold wall vacuum/CVD chamber containing a substrate of nickel or silicon, at pressures of from about 1 to about 50 Torr; and directing a concentrated solar flux of about 40 to about 60 watts/cm² through a suitable transparent face plate into the reactant mixture to provide substrate temperatures in the ranges of from about 750° C. to about 950° C. in order to activate deposition of the film on the substrate.

Reactants for producing diamond products within the context of the invention include volatile hydrocarbons with sufficient vapor pressure to produce pressure of $\sim$1 to 50 tort within the chamber to form sp³-type bonded films. These hydrocarbons include, but are not limited to methane, ethane, ethylene, acetylene, neopentane, and butane, etc. (approximately 1–10% by volume) in admixture with the additional reactant additive of hydrogen. Hydrogen is required to promote the growth of tetregonal sp³-bonding at the carbon atoms. Neopentane may also be utilized to promote the tetregonal sp³-bonding.

Amongst the further additional reactant additives that promote the growth rate of the sp$^3$-bonding percentage of diamond-type materials, two of the most important are fluorine and oxygen. Fluorine can be in the form of F$_2$ or freons such as CF$_4$, and C$_2$F$_6$. Oxygen may be in the form of O$_2$, CO, or CO$_2$. The amount of these reaction promoters that may be employed will vary widely but is usually in the range of 1 to 10%. Therefore, those skilled-in-the-art could employ the technique of the invention process to adapt their particular process to produce sp$^3$-type materials and take advantage of the "non-electrically driven radiant energy source" and the ramifications of processing in space.

Energy requirements to promote the reaction to diamond are accomplished via the high photon flux of solar energy in the form of a photon assisted/coupled reaction and/or substrate heating.

The environment for producing continuous coatings of sp$^3$-bonded diamond films ranges from reactant pressures of 1 millitorr to atmosphere for the reactants, and from temperatures of approximately 300° to about 1500° C. in order to obtain the requisite substrate temperatures of between about 750° C. to 950° C. It must be kept in mind that the substrates for such a reaction must successfully be able to resist degradation of the reactants and the processing environment; and, in the context of the invention, it has been found that Si is most preferred.

The chemical reaction of the invention may be simply described by the reaction formula:

The above equation serves to broadly reflect the range of concentration that can produce our diamond-type films. In this connection, it should be noted that if the substrate were exposed to 1,000 suns, it would take a shorter time to achieve a similar result than if the substrate were exposed to 50 suns.

The vacuum chamber was assembled, and methane admixed with hydrogen is pumped thereinto after the chamber is purged with N$_2$ in order to cleanse all vacuum lines. All regulators or valves were saturated at 2 psig while the chamber was kept at about 40 Torr N$_2$ overnight, after bringing the sample up to about 250° C. with diffuse radiation. The substrate used was nickel.

Figure 1:
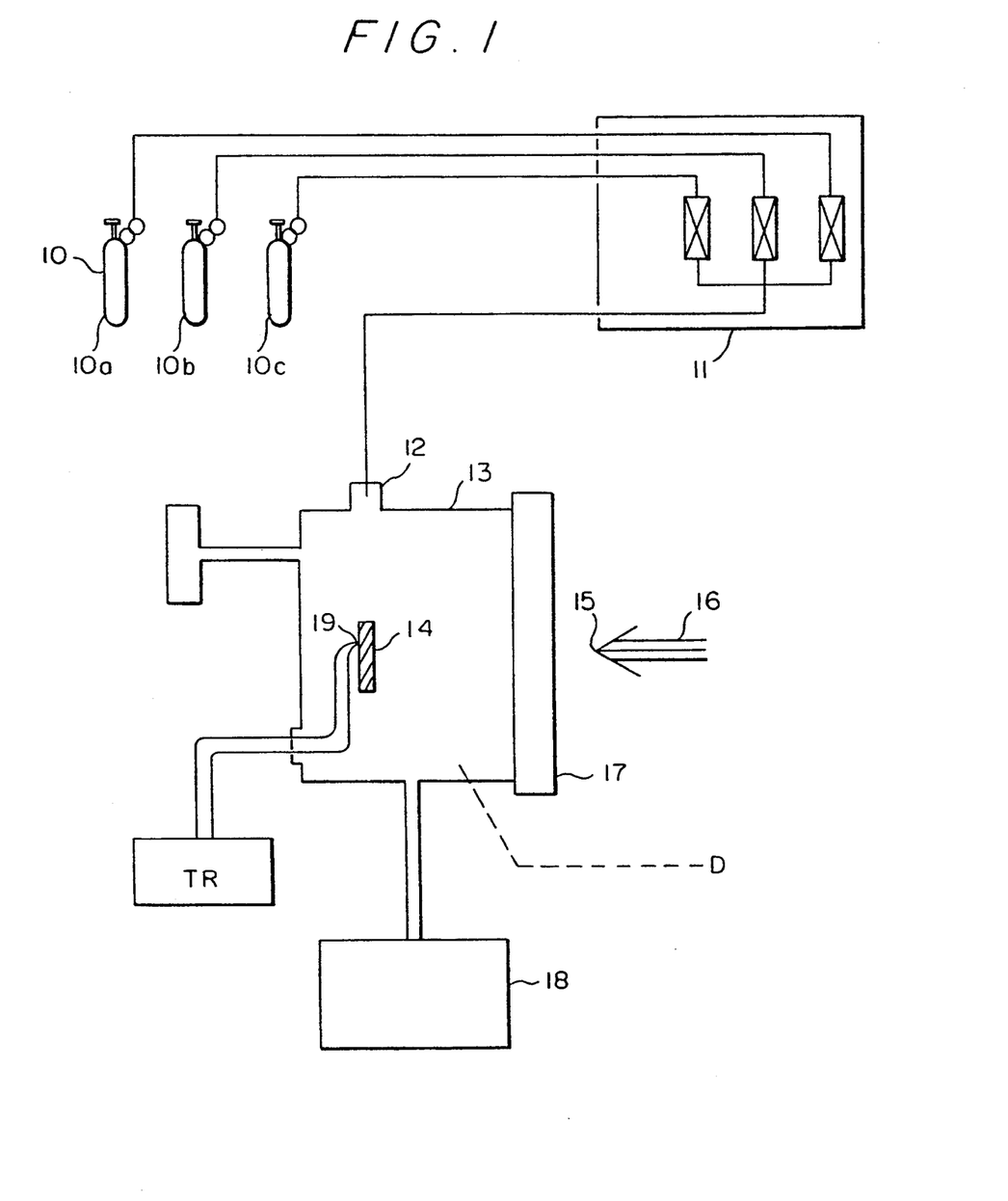
FIG. 1 is a schematic representation of one embodiment of the solar-induced chemical vapor deposition process for producing continuous coatings of sp³-bonded diamond-type carbon films of the present invention.

As can be seen from the flow diagram of FIG. 1, the sources of gases 10, may include a H$_2$ tank 10a, a tank 10b containing a mixture of CH$_4$/H$_2$ and a tank 10c containing other mixtures such as hydrocarbons other than CH$_4$ and neopentane. A mass-flow controller manifold 11 is used to regulate the rate of entry of gases into the entrance 12 of vacuum chamber 13. Disposed within the vacuum chamber is the substrate 14 onto which the deposit of carbon is made upon concentrating a solar flux 15 depicted by the arrowhead and three parallel lines 16, representing concentrated solar flux being transmitted through a quartz face plate 17 attached to the vacuum chamber. A vacuum pump 18 is utilized in order to maintain the vacuum chamber, which has a temperature sensor 19 disposed so as to measure the temperature of the substrate surface through a temperature readout device TR.

The vacuum chamber may be water-cooled if necessary in order to maintain the temperature range conditions necessary to accomplish the deposition of diamond-type carbon films in accordance with the invention. The dotted line D of FIG. 1 shows the path along which cooled water may be submitted in a turn-about type tubing or conduit in order to control the vacuum chamber temperature conditions.

Figure 2:
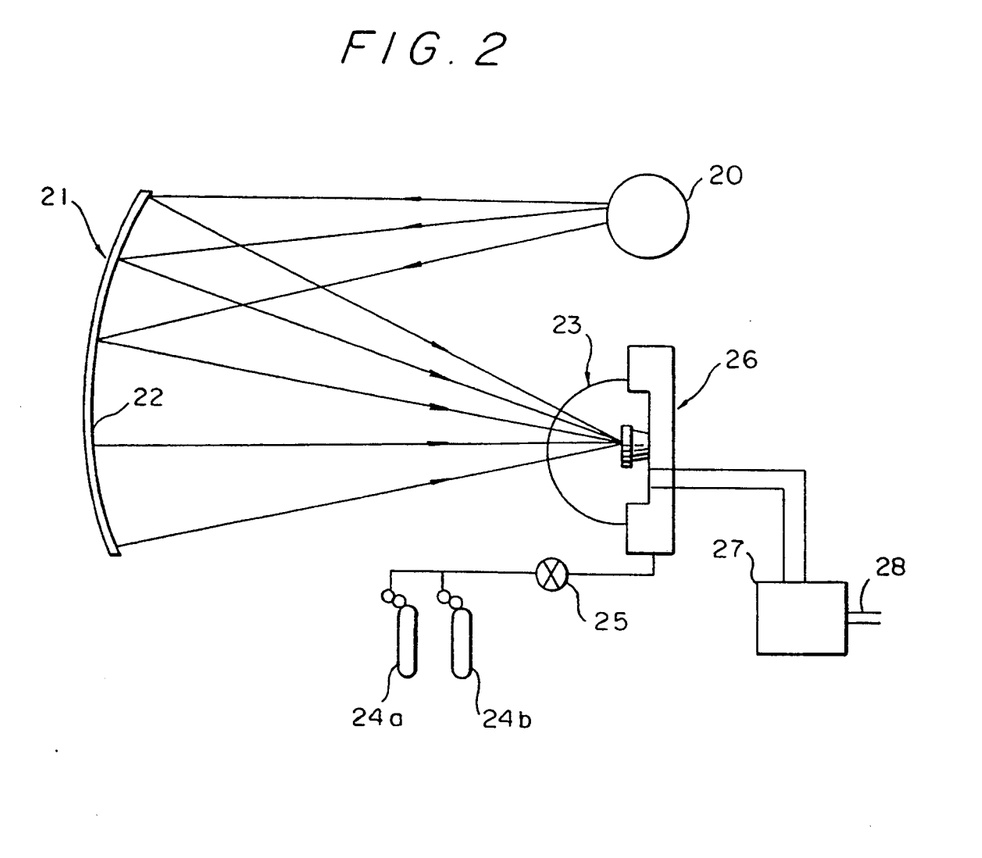
FIG. 2 is a simple schematic representation showing the essence of the solar-induced chemical vapor deposition process for producing continuous coatings of sp³ bonded diamond-type carbon films of the present invention at $\approx$1500 suns, wherein the sun is reflecting from a single fixed focal point concentrator.

FIG. 2 is yet another alternative schematic representation showing the process for providing a solar-induced chemical vapor deposition of diamond-type carbon films of the invention. In this representation, the sun 20 emanates a broad range of rays onto a solar mirror 21 so that the approximate concentration of rays is 20 to 1500 suns. The reflected rays from the concentrator 22 disposed in concave relationship inside of the solar mirror are focused in a converging pattern through a quartz dome 23 in which a mixture of methane and hydrogen gas is contained. Individual gas cylinders for the gases H$_2$ and CH$_4$ are depicted respectively as 24a and 24b, and these gases or mixtures of gases may be regulated by a valve 5. A vacuum chamber 26 is created by a vacuum pump 27 to which an exhaust conduit 28 is attached.

The high photon flux of the solar furnace in the form of a photon assisted/coupled reaction and/or substrate heating device as shown in FIG. 2 for producing diamond-type carbon films would range from reactant pressures of about 1 millitorr to atmosphere for the reactants, and the temperature ranges over which the reaction is carried out would range from about 300° C. to about 1500° C.

Figure 2A:
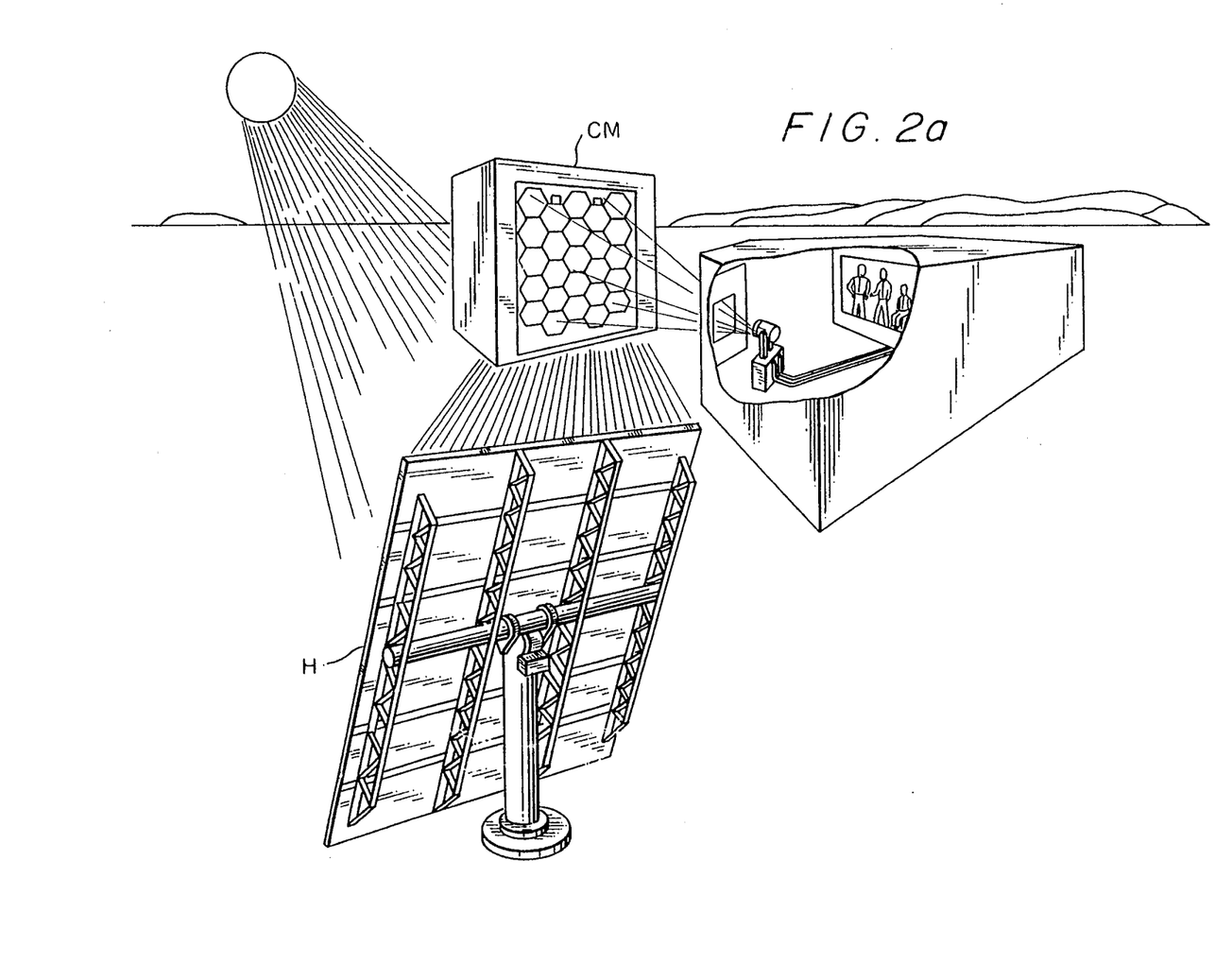
FIG. 2a shows an illustration of the computer-controlled heliostat used to focus sunlight onto a central bank of concentrated mirrors (multifaceted primary concentrator).

FIG. 2a depicts a computer-controlled heliostat H to focus sunlight onto a central bank of concentrated mirrors CM, which are multifaceted primary concentrators, in order to better practice the schematic representation of the solar-induced CVD process of the invention. Our solar facility is capable of ≈2,000 suns concentration with a primary concentrator; with the addition of a secondary concentrator, the concentration is capable of being boosted≈20,000 suns over a diminished area (1 sun=0.1 watt/cm$^2$). By using a heliostat field with a power tower concept, scale-up to high powers over large areas is readily available. While the process of the invention used the concentrator system to 40 to 60 suns or watts/cm$^2$, it should be known that the full power of the concentrated system may be used.

It has been found that the substrate temperatures play an important role in determining the success of the process as well as the rate of diamond-type carbon films deposited, since the substrates must be capable of reaching certain necessary temperatures of the process while simultaneously being capable of resisting degradation from the reactants and he processing environment. In this connection, the suitable substrates have been found to be silicon and nickel; however, in the context of the invention, the following metals, ceramic materials and semiconductor materials may be used:

Metals—copper, steel, tantalum, chromium, and nickel.
Ceramic Materials—aluminum oxide, zirconium oxide, beryllia and silicon nitride.
Semiconductor Materials—silicon and gallium arsenide.

Above 400° C. nickel appears to catalyze and promote sp$^2$ non-diamond-type bonding (which have useful properties in its own right)—therefore, thin interface layers of silicon nitride or silicon carbide must be interposed to inhibit nickel's tendency to catalyze sp$^2$-type growth and to provide a stable foundation for sp$^3$-type growth.

Suitable hydrocarbons are any volatile hydrocarbons when admixed with hydrogen or neopentane; however, methane is the preferred volatile hydrocarbon.

The deposition conditions for Examples 1 and 2 are as follows:

| DEPOSITION CONDITIONS FOR EXAMPLES 1 AND 2 | | |
|---|---|---|
| DEPOSITION PARAMETERS | EXAMPLE 1 | EXAMPLE 2 |
| GAS (% in $H_2$) | 2% $CH_4$ | 2% $CH_4$ |
| FLOW RATE (SCCM) | 100 | 50 |
| PRESSURE (Torr) | 50.0 | 1.0 |
| AVERAGE TEMP. (OC) * | $\approx 770$ | $\approx 920$ |
| Aprox. Time HRS | 4 | 2 |
| HOT FACETS | 7 | 7 |
| NIPS ** | $\approx 750$ | $\approx 975$ |
| A HENNATOR (% open) | $\approx 25$ | $\approx 25$ |
| CONCEN. FLUX (w/cm$^2$) | $\approx 40$ | $\approx 50$ |

* Operating Conditions
** Normal incident solar radiation measured by a pyrochelinmeter While polycrystalline carbon films on Ni can be accomplished that exhibit sp$^3$-bonding, it has been found that, when diamond polished silicon wafers are used as the substrate, promotion of the sp$^3$-bonding of the carbon films in the process of the invention is even better. Moreover, the film formed as a result of the process of the invention is a transparent polycrystalline diamond-type film using a concentrated solar flux as the sole source of basic energy to impel or drive the process.

When silicon is the target or substrate, 2% by volume of methane in hydrogen (and no other gases) wherein the pressure is 1 Torr, the flow is 50 SCCM, and the temperature T is brought to about 900° C., causes deposition to proceed in about 2 hours.

On the other hand, if the temperature is held in the vicinity of approximately 770° C., the deposition will take approximately 4 hours. However, the pressure must be in the range of about 50 Torr at the lower temperature range of 770° C.

Figure 3:
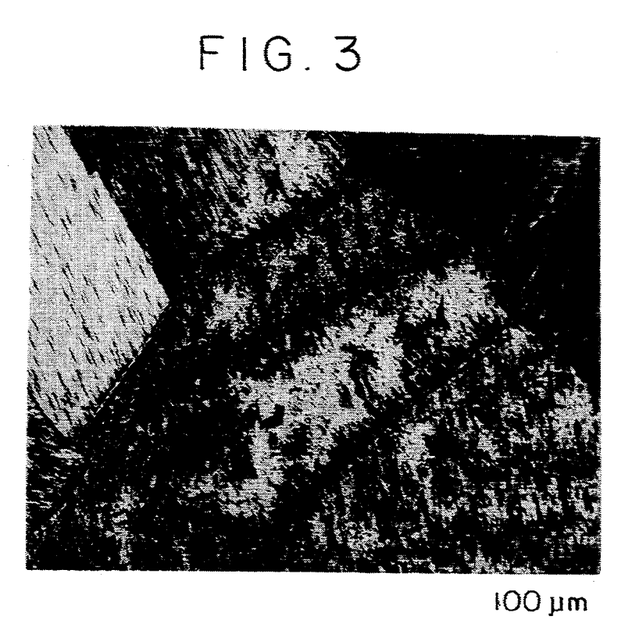
FIG. 3 is a photomicrograph at 200× of a carbon film prepared by the process of the invention.

FIG. 3 is a photomicrograph of a carbon film at 200× prepared in accordance with the process of the invention.

Figure 4:
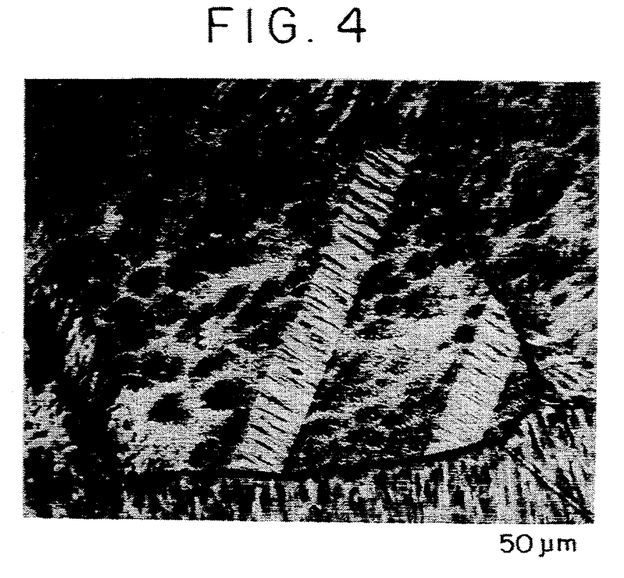
FIG. 4 is a photomicrograph at 400× of a carbon film prepared by the process of the invention.

FIG. 4 is a photomicrograph of a carbon film at 400× prepared in accordance with the process of the invention.

These carbon films are valuable tetregonal sp$^3$-bonded carbon materials having a thickness of approximately 1 μm.

There are distinctions in Auger spectra for diamond, graphite and amorphous-carbon, and these distinctions are set forth in a publication by H. Isai and P. B. Bogy, "CRITICAL REVIEWS: CHARACTERIZATION OF DIAMOND-LIKE CARBON FILMS", J. Vac. Sci. Techno. A, Vol. #5, No. 6, November/December 1987. For example, as can be seen from FIG. 5, the Auger spectra of diamond is characterized by the encircled double peaks.

Figure 5:
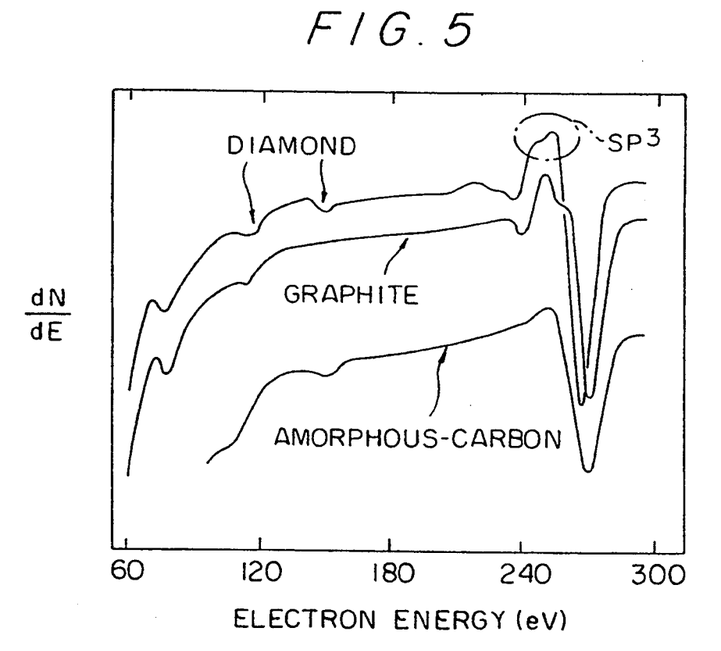
FIG. 5 is a graph of an Auger spectra of diamond, graphite and amorphous carbon.
Figure 6:
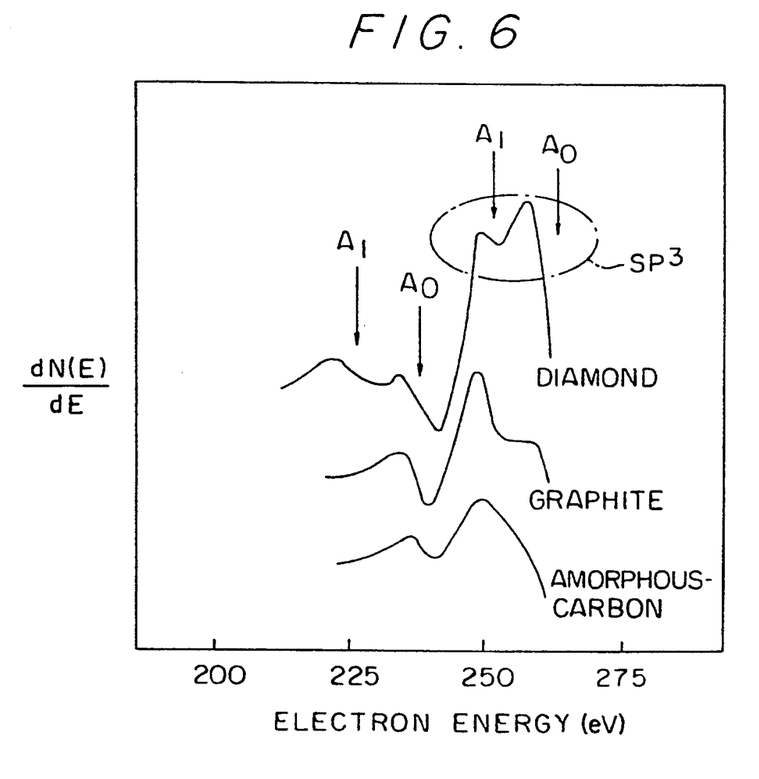
FIG. 6 is an enlargement of the graph of FIG. 5.

FIG. 6 is an enlarged version of FIG. 5, and permits the double peak establishing the diamond structure that has sp$^3$ bonding to be seen more easily.

Figure 7:
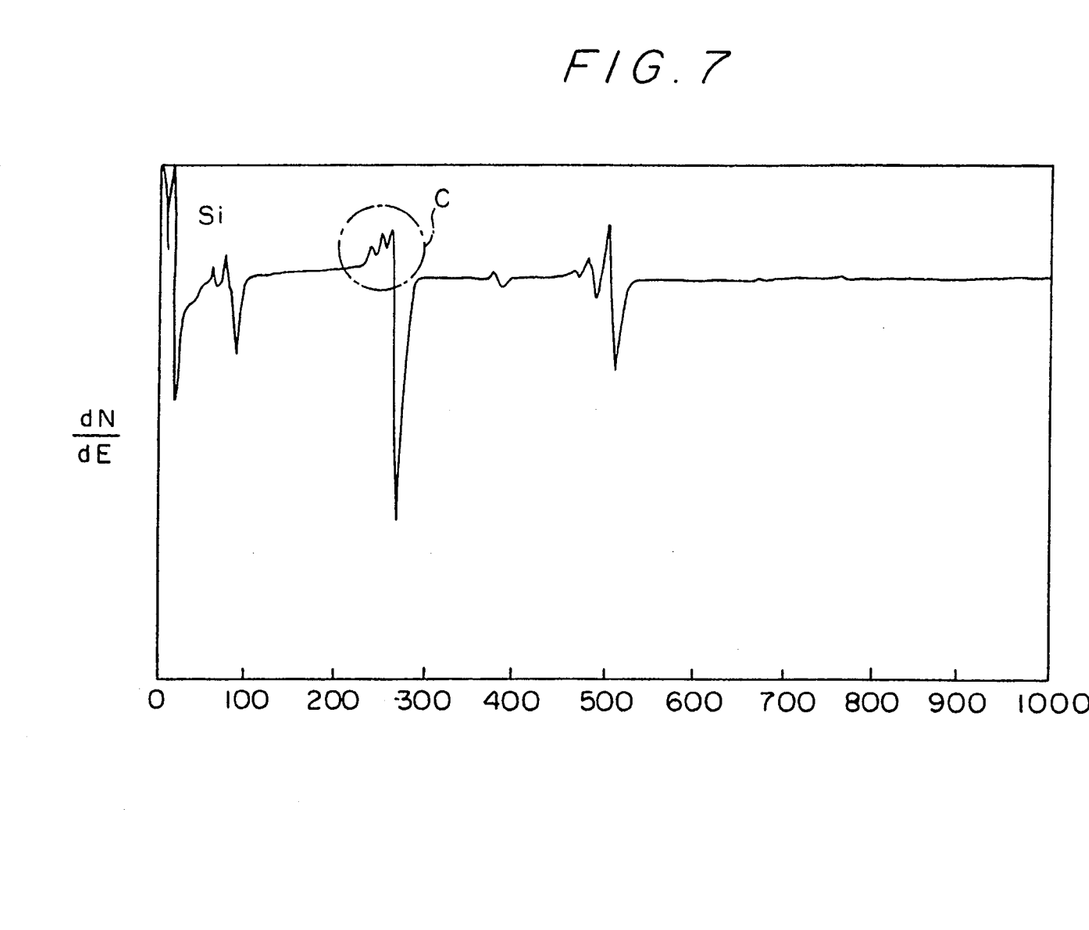
FIG. 7 shows a graph of an Auger analysis of a diamond-type carbon film prepared according to the process of the invention.

A comparison of the Auger spectra of diamond from FIGS. 5 and 6 with the spectra of FIG. 7 (which represents Example 2 of the present invention) shows that the encircled dual peak C establishes unequivocally that the carbon film clearly has sp$^3$ bonding.

Similarly, a comparison of the Auger spectra for diamond of FIGS. 5 and 6 with FIG. 7, also shows the double peak characteristic of the sp$^3$ bonding is at about 250 ev electron energy.

Figure 8:
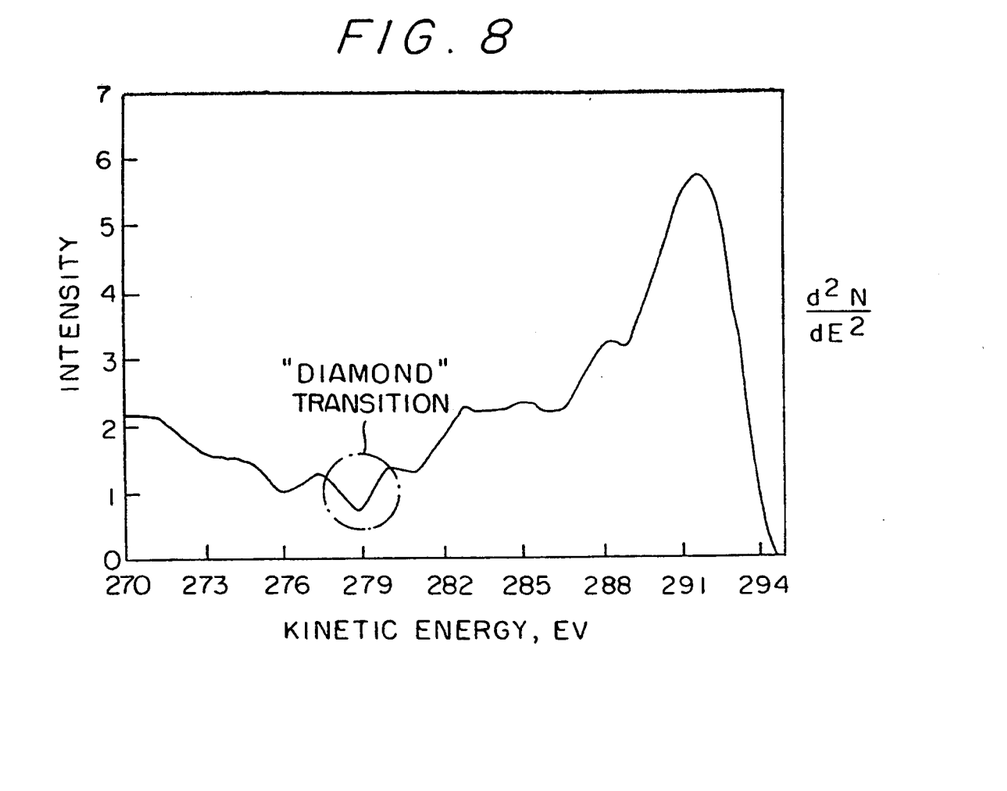
FIG. 8 is a graph of Electron Energy Loss Spectroscopy (EELS) showing a typical diamond transition or a diamond reference point.

FIG. 8 shows a graph of Electron Energy Loss Spectroscopy (EELS) of a typical diamond transition or a diamond reference point.

Figure 9:
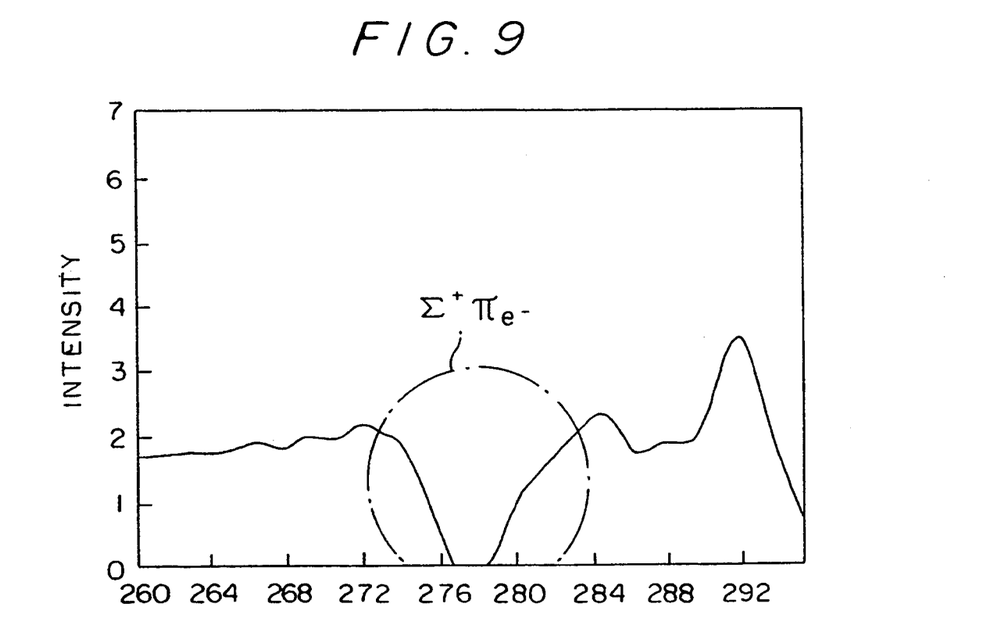
FIG. 9 shows a graph of EELS of a diamond-type carbon film prepared according to the process of the invention.

FIG. 9 is a graph of EELS of a diamond-type carbon film prepared according to the process of the invention. The diamond transition value measured in kinetic energy (EV) is shown at a value between 276 and 280.

FIG. 8 represents a reference and FIG. 9 represents a sample, and they represent the electron energy loss spectroscopy for Example 1 of the invention.

Again, FIG. 8 depicts an EELS trace of a reference standard of a known diamond-type film. FIG. 9 shows our trace sample which mimics the diamond transition of the reference.

The electron energy loss spectroscopy (EELS) analyses confirms the presence of sp$^3$-bonded carbon in the example (diamond transition at a 278 eV).

Figure 10:
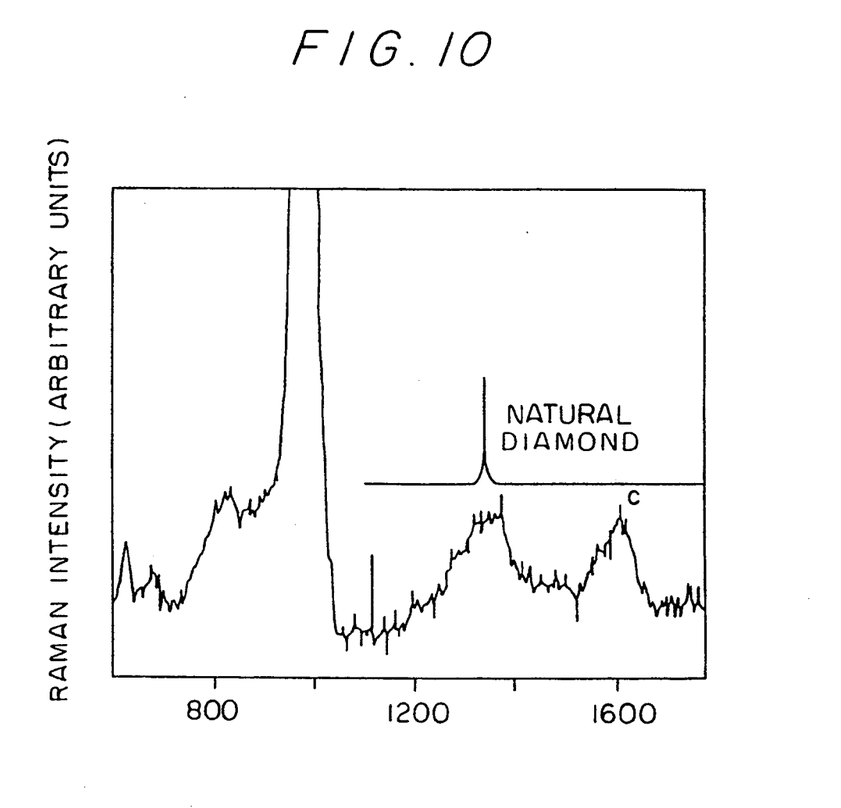
FIG. 10 is a graph of Raman spectroscopy confirming the presence of sp³-bonded carbon, where the transition is at 2 =$\approx$1340 cm$^{-1}$.

FIG. 10 shows the Raman intensity (arbitrary units) for the sample of Example 1. The Raman spectroscopy confirms the presence of sp$^3$-bonded carbon, transition at $2 = \approx 1340$ cm$^{-1}$.

The transparent carbon films of approximately 1 μm thickness have been deposited on nickel and silicon substrates using the process of the invention as a solar assisted chemical vapor deposition process.

In the preferred embodiment, the concentrated solar flux of 40–60 watts/cm$^2$ is directed into a $CH_4/H_2$ gas mixture to provide substrate temperatures of approximately 750° to 950° C. in a specialized cold-wall vacuum/CVD type reactor at 1 to 50 Tort pressure. The high photon flux CVD process produces diamond-type tetregonal sp$^3$-bonding as evidenced from the Auger electron energy loss spectroscopy (EELS) and Raman spectroscopy. The scanning electron microscope (SEM) photographs shown in FIGS. 3 and 4 at up to 400× and the characteristic doublet Auger spectra (at approximately 280eV) shows a polycrystalline diamond-like morphology.

The results of this process represent the first successful application of a solar photon/thermally activated CVD process to produce sp$^3$-bonded diamond-type carbon films. The advantages of using a concentrated solar flux to induce CVD makes the process inherently more energy efficient and more environmentally benign than conventional processes, since the direct utilization of concentrated solar energy eliminates the wasteful drawbacks of predominantly electrically-driven processes. As such fossil fuels do not have to be dug from the ground, processed and burned, and any by-products from the foregoing processes would not have to be scrubbed in order for these by-products to be released to the environment. Alternatively, uranium would not have to be mined, refined or stored for years as a radioactive hazard to provide electric power to the process of the invention.

The advantages of the invention further include the following: the solar furnace process provides a means of delivering large photon flux densities over short time spans that allows for exceptionally high heating rates; the economics of utilizing a solar furnace for materials processing is very competitive; the process can be scaled-up to produce enormous energy densities over large substrate areas; and high energy photons in the UV region of the solar spectrum can directly interact with reactant species on substrate surfaces to produce catalytic increases in the efficiency of deposition.

Further still, the invention is ideally suited to process diamond-type materials in space, for the reason that, the non-electrical nature and inherent efficiency of our solar CVD process, coupled with the increased intensity of radiation outside the earth's atmosphere provide compelling advantages. Yet further, the invention permits both increased intensity and extension of the UV solar spectrum in vacuum spaced AMO irradiants to provide increased opportunity for photolytic activation of the CVD process; high energy UV radiation below 400 nm comprises $\frac{1}{2}$% of total ($\lambda min \approx 305$ nm) for and terrestrial AM—1.5 and quintuples to approximately 13% ($\lambda min \approx 200$ nm) for AM—O.

The utility of the invention is clearly borne out, since the absence of gravity will eliminate most of the structural engineering and support required for a terrestrial solar furnace and allow inexpensive and lightweight construction in space.

Finally, the vacuum environment of space will eliminate the need for expensive vacuum pumps and make the process of the invention very convenient for low pressure processing.

While the foregoing description and illustration of the invention has been particularly shown in detail with reference to preferred embodiments, it should be understood by those skilled in the art that the foregoing and other modifications are exemplary only, and that equivalent changes in detail may be employed therein without departing from the spirit and scope of the invention as claimed, except as precluded by the prior art.

The embodiments of the invention which exclusive property or privilege is claimed are defined as follows:

What is claimed is:

1. A chemical vapor deposition method for depositing transparent continuous coatings of $sp^3$-bonded diamond carbon film, comprising:

a) providing a volatile hydrocarbon gas/ $H_2$ reactant mixture in a cold wall vacuum chemical vapor deposition chamber containing a substrate for said films, at pressures of from about 1 to about 50 Torr; and b) directing a concentrated solar flux of from about 40 to about 60 watts/cm$^2$ through said reactant mixture to produce substrate temperatures of about 750° C. to about 950° C. to activate deposition of the film on said substrate.

2. The process of claim 1, wherein the volatile hydrocarbon is methane.

3. The process of claim 1, wherein the volatile hydrocarbon is ethane.

4. The process of claim 1, wherein the volatile hydrocarbon is ethylene.

5. The process of claim 2, wherein the substrate is Ni on which an interface layer selected from silicon nitride or silicon carbide has been interposed prior to providing said volatile hydrocarbon gas/$H_2$ reactant mixture.

6. The process of claim 2, wherein the substrate is polycrystalline silicon.

7. The process of claim 2, wherein the substrate is gallium arsenide.

8. The process of claim 2, wherein the substrate is a single crystalline silicon.

9. The process of claim 2, wherein the substrate is a polycrystalline silicon wafer prepolished with about 1 $\mu$m diamond powder.

10. The process of claim 2, wherein the methane is from about 1 to about 10% by volume in hydrogen.

11. The process of claim 1, wherein neopentane is substituted for hydrogen.

12. The process of claim 1, wherein neopentane is admixed with hydrogen.

* * * * *